United States Patent
Povolny et al.

(10) Patent No.: US 8,454,027 B2
(45) Date of Patent: Jun. 4, 2013

(54) ADJUSTABLE THERMAL CONTACT BETWEEN AN ELECTROSTATIC CHUCK AND A HOT EDGE RING BY CLOCKING A COUPLING RING

(75) Inventors: Henry S. Povolny, Newark, CA (US); Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 816 days.

(21) Appl. No.: 12/565,436

(22) Filed: Sep. 23, 2009

(65) Prior Publication Data

US 2010/0078899 A1 Apr. 1, 2010

Related U.S. Application Data

(60) Provisional application No. 61/194,277, filed on Sep. 26, 2008.

(51) Int. Cl.
*B23B 31/28* (2006.01)
(52) U.S. Cl.
USPC .............. 279/128; 414/941; 361/234
(58) Field of Classification Search
USPC .............. 279/128; 414/491; 361/234
IPC ........................................ B23B 31/28
See application file for complete search history.

(56) References Cited

U.S. PATENT DOCUMENTS

| | | | | |
|---|---|---|---|---|
| 5,606,485 A | * | 2/1997 | Shamouilian et al. | 361/234 |
| 5,812,362 A | * | 9/1998 | Ravi | 361/234 |
| 5,958,265 A | * | 9/1999 | Ogahara | 219/121.43 |
| 5,978,202 A | * | 11/1999 | Wadensweiler et al. | 361/234 |
| 6,268,994 B1 | * | 7/2001 | Logan et al. | 361/234 |
| 6,383,931 B1 | * | 5/2002 | Flanner et al. | 438/689 |
| 6,391,787 B1 | * | 5/2002 | Dhindsa et al. | 438/710 |
| 6,464,794 B1 | * | 10/2002 | Park et al. | 118/728 |
| 6,475,336 B1 | | 11/2002 | Hubacek | |
| 6,524,026 B2 | * | 2/2003 | Sondrup | 404/26 |
| 6,721,162 B2 | * | 4/2004 | Weldon et al. | 361/234 |
| 6,831,823 B2 | * | 12/2004 | Ishida | 361/234 |

(Continued)

FOREIGN PATENT DOCUMENTS

| | | |
|---|---|---|
| WO | WO-2004027815 A1 | 4/2004 |
| WO | WO-2005059962 A2 | 6/2005 |

OTHER PUBLICATIONS

"International Application Serial No. PCT/US2009/058034, Search Report mailed Apr. 30, 2010", 7 pgs.

(Continued)

*Primary Examiner* — Eric A Gates
*Assistant Examiner* — Bayan Salone
(74) *Attorney, Agent, or Firm* — Schwegman Lundberg & Woessner, P.A.

(57) ABSTRACT

A clockable device for use with an electrostatic chuck configured to hold a substrate in a plasma environment is disclosed. The clockable device comprises a first portion of the electrostatic chuck having at least one face with variable thermal contact areas located thereon. A second portion of the electrostatic chuck has at least one face with variable thermal contact areas located thereon. The at least one face of the second portion is configured to be placed in thermal contact with the at least one face of the first portion to control a thermal gradient across a face of the substrate.

24 Claims, 4 Drawing Sheets

U.S. PATENT DOCUMENTS

| | | | |
|---|---|---|---|
| 6,878,233 B2* | 4/2005 | Hirose | 156/345.28 |
| 7,244,336 B2* | 7/2007 | Fischer et al. | 156/345.51 |
| 7,252,738 B2* | 8/2007 | Tong et al. | 156/345.29 |
| 7,275,577 B2* | 10/2007 | Lee et al. | 156/351 |
| 7,618,516 B2* | 11/2009 | Bera et al. | 156/345.43 |
| 7,670,436 B2* | 3/2010 | Miller et al. | 118/728 |
| 7,848,076 B2* | 12/2010 | Narendranath et al. | 361/234 |
| 7,867,356 B2* | 1/2011 | Tong et al. | 156/379.6 |
| 7,879,731 B2* | 2/2011 | Collins et al. | 438/714 |
| 8,012,888 B2* | 9/2011 | Ishiguro | 438/795 |
| 8,084,375 B2* | 12/2011 | Koshiishi et al. | 438/800 |
| 2001/0015262 A1* | 8/2001 | Denpoh | 156/345 |
| 2003/0145950 A1* | 8/2003 | Hirose | 156/345.43 |
| 2004/0083975 A1* | 5/2004 | Tong et al. | 118/728 |
| 2004/0095546 A1* | 5/2004 | Lee et al. | 349/187 |
| 2004/0190215 A1* | 9/2004 | Weldon et al. | 361/234 |
| 2005/0133164 A1* | 6/2005 | Fischer et al. | 156/345.51 |
| 2006/0090706 A1 | 5/2006 | Miller et al. | |
| 2008/0006204 A1* | 1/2008 | Rusinko et al. | 118/715 |
| 2008/0041820 A1* | 2/2008 | Tong et al. | 216/67 |
| 2008/0182416 A1* | 7/2008 | Collins et al. | 438/710 |
| 2009/0061542 A1* | 3/2009 | Patrick | 438/10 |
| 2010/0044974 A1* | 2/2010 | Kenworthy et al. | 279/128 |
| 2010/0243606 A1* | 9/2010 | Koshimizu et al. | 216/67 |

OTHER PUBLICATIONS

"International Application Serial No. PCT/US2009/058034, Written Opinion mailed Apr. 30, 2010", 3 pgs.

"European Application Serial No. 09816793.5, Search Report mailed Nov. 22, 2012", 3 pgs.

"International Application Serial No. PCT/US2009/058034, International Preliminary Report on Patentability mailed Apr. 7, 2011", 5 pgs.

* cited by examiner

ADJUSTABLE THERMAL CONTACT BETWEEN AN ELECTROSTATIC CHUCK AND A HOT EDGE RING BY CLOCKING A COUPLING RING

CROSS-REFERENCE TO RELATED APPLICATIONS

This application claims priority benefit of U.S. Provisional Patent Application No. 61/194,277, entitled, "Adjustable Thermal Contact Between an Electrostatic Chuck and A Hot Edge Ring by Clocking a Coupling Ring," filed Sep. 26, 2008, which is hereby incorporated by reference in its entirety.

TECHNICAL FIELD

The present invention relates generally to the field of process equipment used in the semiconductor, data storage, flat panel display, as well as allied or other industries. More particularly, the present invention relates to a system for enhancing performance of electrostatic chucks used in plasma-based process tools.

BACKGROUND

Semiconductor device geometries (i.e., integrated circuit design rules) have decreased dramatically in size since integrated circuit (IC) devices were first introduced several decades ago. ICs have generally followed "Moore's Law," which means that the number of devices fabricated on a single integrated circuit chip doubles every two years. Today's IC fabrication facilities are routinely producing 65 nm (0.065 µm) feature size devices, and future fabs will soon be producing devices having even smaller feature sizes.

As IC design rules shrink, an increasing trend in semiconductor manufacturing is utilizing single-wafer processing for a variety of fabrication steps, including plasma etching and deposition chambers. Single-wafer reactors must be designed to unobtrusively secure the wafer (or other substrate-type) during processing, while controlling both temperature and temperature uniformity across the wafer.

Mechanical wafer clamps which engage a portion of front surfaces of the wafer where processing is to be performed potentially create process uniformity problems by interfering with gas flow, altering plasma distribution, and acting as a heat sink. If improperly designed, mechanical wafer clamps may also produce particulates with resulting contamination of the wafer as well as other problems.

An electrostatic chuck (ESC) uses an electrostatic potential to hold a wafer in place during processing, thus avoiding the problems of mechanical clamping by having contact with only the back side of the wafer. Electrostatic chucks operate by inducing opposing charges on the substrate and the chuck thereby resulting in an electrostatic attraction between the chuck and the substrate. A degree of attraction is dependent on an amount of charge induced as well as a rate at which the charge dissipates due to conductive effects. Voltage biasing is employed to induce and control the electrostatic force and may be applied for only a portion of a processing cycle, for example, just after a substrate is transferred to the chuck. Alternatively, voltage biasing may be applied continuously throughout a processing cycle. For instance, using the conduction properties of plasma can provide a means of electrical connection to one terminal of a ESC and wafer system.

Various types of electrostatic chucks may include consumable (i.e., sacrificial) edge rings positioned below and around the substrate for purposes of confining plasma to the area immediately proximate to and above the substrate. The edge rings may also protect the ESC from erosion by the plasma.

With reference to FIG. 1, a portion of an exemplary prior art ESC structure 100 includes an anodized aluminum base 101, a heater bond layer 103, a heater 105, a heater plate 107, and a ceramic bond layer 109. The ESC structure 100 is capped with a ceramic top piece 111. The heater bond layer 103, heater 105, heater plate 107, and ceramic bond layer 109 are protected from direct contact with a surrounding plasma environment and caustic chemicals by an edge bonding seal 113. The edge bonding seal 113 thus protects the heater 105, the heater plate 107, and the heater 103 and ceramic 109 bonding layers from plasma erosion.

The heater bond layer 103 is typically comprised of a silicone layer impregnated with silica (e.g., amorphous $SiO_x$). The heater 105 is frequently comprised of metallic resistance elements encapsulated in a polyimide while the heater plate 107 is typically fabricated from aluminum. A ceramic-filled (e.g., alumina ($Al_2O_3$)) silicone material is commonly employed for the ceramic bond layer 109. The ceramic top piece 111 is commonly fabricated from alumina and is configured to allow a substrate 115, such as a silicon wafer, to be securely held in place over the ceramic top piece 111.

An edge ring 117 is typically circular in overall shape and is secured to a periphery of an inner portion of the exemplary prior art ESC structure 100. The edge ring 117 is placed concentrically about the inner portion of the ESC structure 100 and features a vertical, single-surface inner diameter. The single-surface inner diameter constrains the edge ring 117 against the aluminum base 101, the edge bonding seal 113, and the ceramic top piece 111 thus nominally centering the edge ring 117.

In general, an edge ring (e.g., a hot edge ring, HER) that runs too hot during high power polymerizing chemistry in a plasma reactor forces polymers to the edges of a substrate (due to thermophoretic forces). The increased level of polymers on or near the edges of the substrate reduces critical dimensions (CDs) of planned features on the substrate. In contrast, if the edge ring is running too cool, then polymer deposited on the edge ring itself increases thereby causing increased CDs on or near the edges of the substrate (i.e., the thermal gradient between the substrate and the edge ring forces polymer precursors to deposit on the edge ring).

Therefore, a balance between hot and cool areas on the ESC must be achieved to allow proper CD uniformities across the surface of a substrate. Additionally, an optimal thermal balance configuration to achieve expected CD results must be achieved without incurring productivity issues that are unique for both differing chemistries and plasma power levels.

Therefore, what is needed is a thermal interface system to balance a temperature of an edge ring between running too hot or too cold. The thermal interface system should be quickly and easily configured for different processes (i.e., the system should be readily adjustable in the field). Additionally, the temperature of the edge ring should be readily tailored through the thermal interface system for a given set of operating parameters, such as plasma power level.

SUMMARY

In an exemplary embodiment, a clockable device for use with an electrostatic chuck configured to hold a substrate in a plasma environment is disclosed. The clockable device comprises a coupling ring configured to surround a periphery of at least a portion of the electrostatic chuck and thermally contact an edge ring mounted in proximity to the electrostatic chuck. The coupling ring comprises a first portion of the coupling ring having a first set of opposing faces with at least one of the first set of opposing faces having a first plurality of raised features formed thereon. A second portion of the coupling ring has a second set of opposing faces with at least one of the second set of opposing faces having a second plurality of raised features formed thereon and arranged to be thermally coupled to the first plurality of raised features. A degree of thermal coupling between the first and second portions is configured to be controlled by clocking the first portion with respect to the second portion.

In another exemplary embodiment, a clockable device for use with an electrostatic chuck configured to hold a substrate in a plasma environment is disclosed. The clockable device comprises an edge ring configured to surround a periphery of at least a portion of the electrostatic chuck and thermally contact the electrostatic chuck. The edge ring comprises a lower face having a first plurality of raised features formed thereon. A second plurality of raised features is formed on a portion of the electrostatic chuck in thermal contact with the edge ring. The second plurality of raised features is arranged to be thermally coupled to the first plurality of raised features with a degree of thermal coupling between the edge ring and the electrostatic chuck configured to be controlled by clocking the edge ring with respect to the second plurality of raised features.

In another exemplary embodiment, a clockable device for use with an electrostatic chuck configured to hold a substrate in a plasma environment is disclosed. The clockable device comprises an edge ring configured to surround a periphery of at least a portion of the electrostatic chuck and thermally couple to the electrostatic chuck. The edge ring comprises a lower face having a first plurality of raised features formed thereon. A coupling ring has at least a second plurality of raised features and is configured to be placed into thermal contact with the first plurality of raised features on the edge ring. The second plurality of raised features is arranged to be thermally coupled to the first plurality of raised features with a degree of thermal coupling between the edge ring and the coupling ring configured to be controlled by clocking the edge ring with respect to the coupling ring.

In another exemplary embodiment, a clockable device for use with an electrostatic chuck configured to hold a substrate in a plasma environment is disclosed. The clockable device comprises a first portion of the electrostatic chuck having at least one face with variable thermal contact areas located thereon. A second portion of the electrostatic chuck has at least one face with variable thermal contact areas located thereon. The at least one face of the second portion is configured to be placed in thermal contact with the at least one face of the first portion to control a thermal gradient across a face of the substrate.

BRIEF DESCRIPTION OF THE DRAWINGS

Various ones of the appended drawings merely illustrate exemplary embodiments of the present invention and must not be considered as limiting its scope.

DETAILED DESCRIPTION

Various embodiments discussed below describe an improved coupling ring designed to enhance process performance. Process performance is enhanced by ensuring the coupling ring is able to provide a known thermal gradient for given operating conditions (e.g., at a given plasma power level). The thermal gradient may be controlled by, for example, a clockable coupling ring having adjustable thermal contact between the ESC and a hot edge ring (HER). Thermal contact can be adjusted quickly and easily without necessarily requiring additional hardware or a change in selection of thermal interface materials.

Figure 1A:
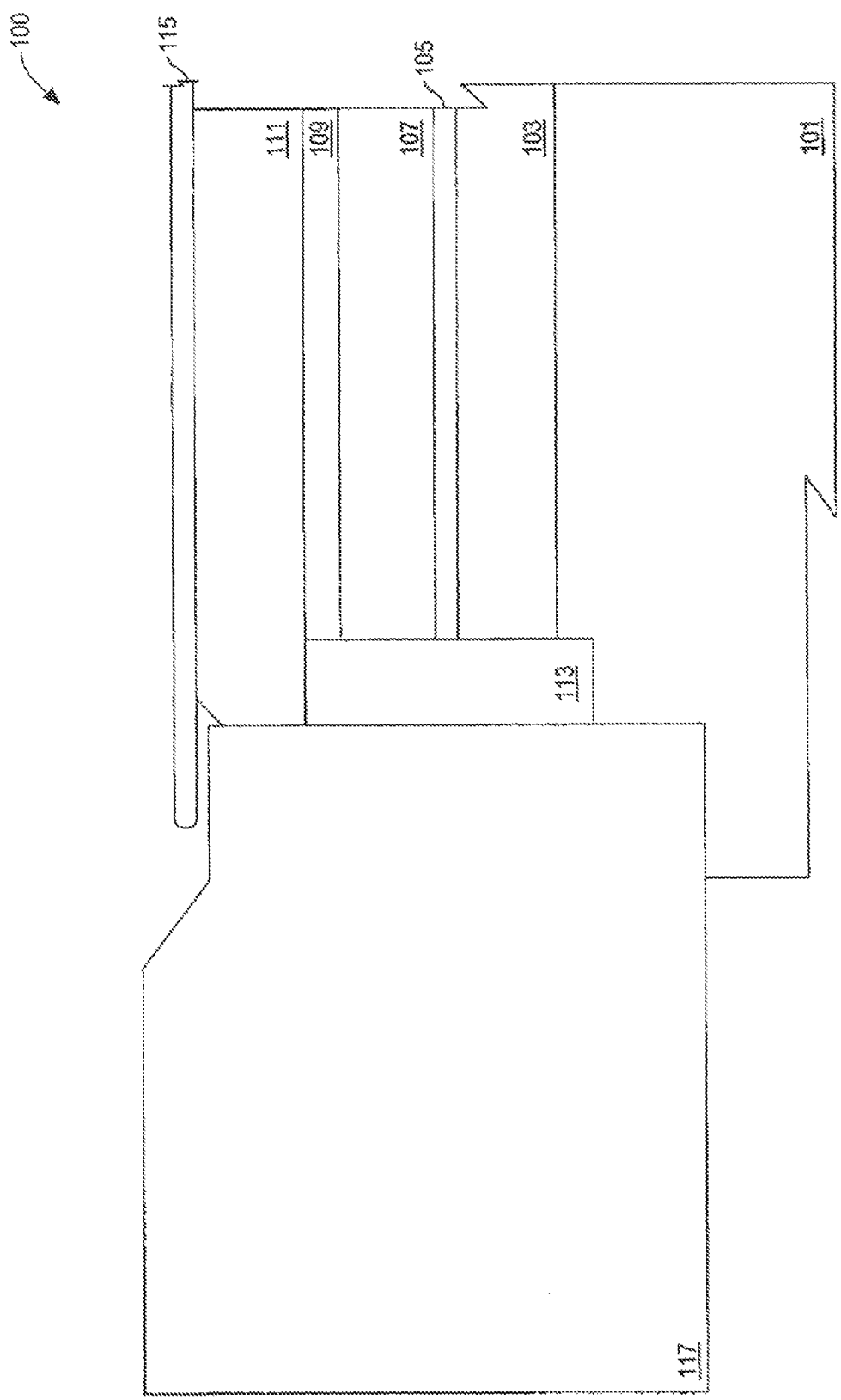
FIG. 1A is a cross-sectional view of a portion of a prior art electrostatic chuck.
Figure 1B:
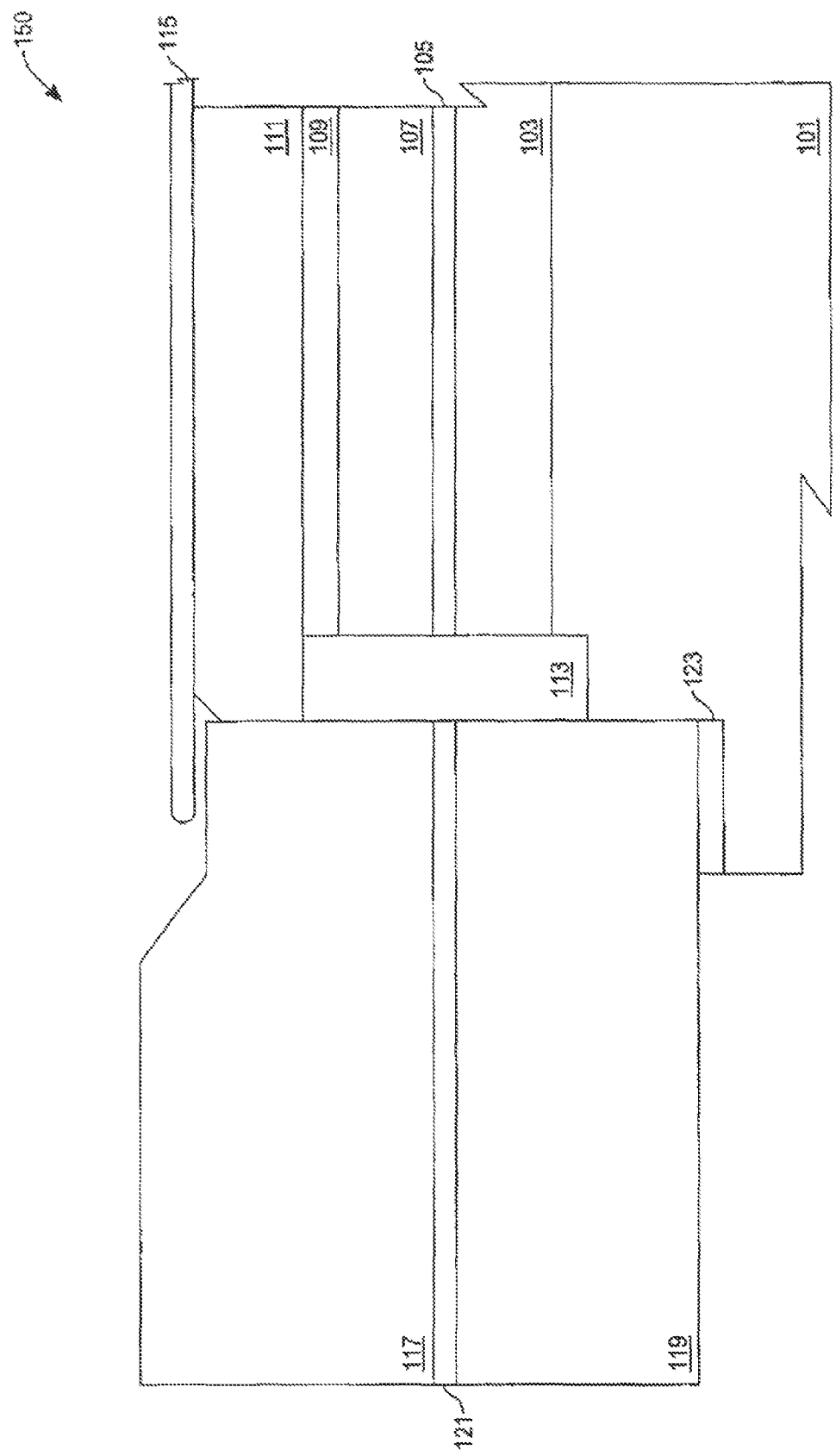
FIG. 1B is a cross-sectional view of a portion of a prior art electrostatic chuck incorporating a coupling ring and various layers of thermal interface material.
Figure 2:
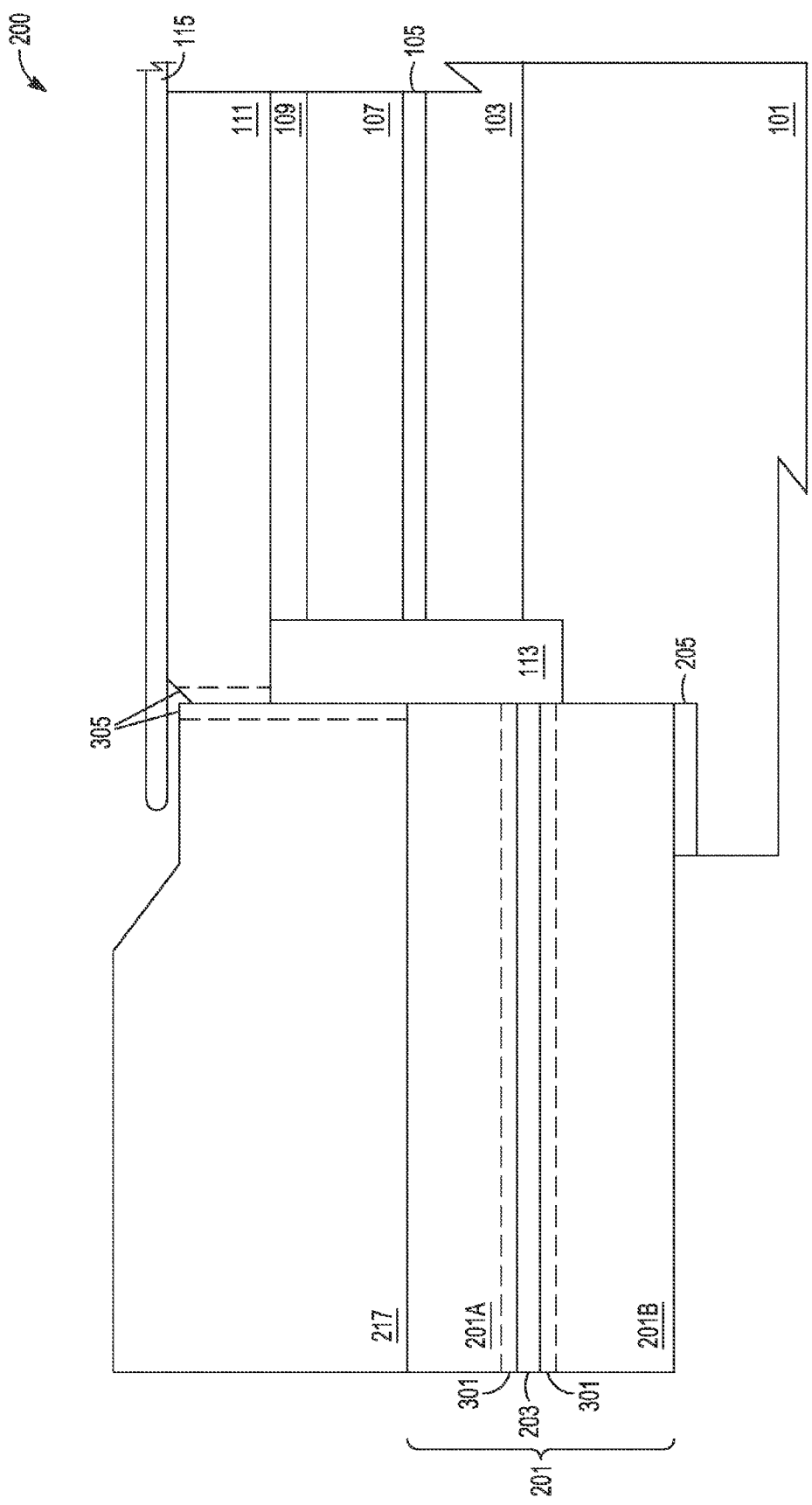
FIG. 2 is a cross-sectional view of an exemplary clockable coupling ring used on an electrostatic chuck (ESC) to vary a temperature gradient between the ESC and a hot edge ring.

With reference to FIG. 2, a cross-sectional view 200 of an ESC is also shown to include an exemplary clockable coupling ring 201 and an edge ring 217. The exemplary clockable coupling ring 201 is comprised of at least two portions, an upper coupling ring portion 201A and a lower coupling ring portion 201B. An optional coupling ring thermal interface material layer 203 may be sandwiched between the upper 201A and the lower 201B coupling ring portions. Additionally, an optional ESC thermal interface material layer 205 may be added between the aluminum base plate 101 and the lower coupling ring portion 201B. The upper coupling ring portion 201A and the lower coupling ring portion 201B each include a plurality of raised features 301. Additionally, the ceramic top piece 111 of the ESC and the edge ring 217 may also have another optional plurality of raised features 305. The plurality of raised features 301, 305 are discussed in more detail with reference to FIG. 3 and FIG. 4, below.

The upper 201A and the lower 201B coupling ring portions may be comprised of a variety of materials. The variety of materials includes, for example, aluminum oxide ($Al_2O_3$, "alumina") or other types of ceramics. Silicon, silicon carbide, silicon dioxide (e.g., crystalline or amorphous ($SiO_x$)), and transitional metals such as solid yttrium are also suitable materials from which to fabricate the upper 201A and the lower 201B coupling ring portions. Additionally, various other types of metallic, insulating, and semiconducting materials may also be readily employed. In a specific exemplary embodiment, aluminum oxide ($Al_2O_3$) coated with an yttrium oxide finish 75 micrometers ($\mu m$) to 125 $\mu m$ (approximately 0.003 to 0.005 inches) in thickness may be used for the upper 201A and the lower 201B coupling ring portions. The yttrium oxide finish may be applied by, for example, thermo-spraying or applied from a physical vapor deposition (PVD) system. In this embodiment, the yttrium oxide finish may taper in certain areas as required or entire portions of the upper 201A and the lower 201B coupling ring portions may be left uncoated.

In a specific exemplary embodiment, the optional coupling ring 203 and the ESC 205 thermal interface material layers may be comprised of, for example, a Q-Pad® heat transfer material, such as Q-Pad® II. Q-Pad® is manufactured by The Bergquist Company (Chanhassen, Minn., USA) and is a foil-format thermal grease replacement especially formulated for use where outgassing materials cannot be used, such as the high-vacuum environment of a plasma etch chamber. Q-Pad® is comprised of aluminum foil formed on opposing faces of a thermally and electrically conductive rubber with a thermal impedance of 1.42° C. $cm^2/W$ (approximately 0.22° C. $in^2/W$) at 345 kPa (approximately 50 psig).

In another specific exemplary embodiment, the coupling ring 203 and the ESC 205 thermal interface materials may be comprised of, for example, Sil-Pad® heat transfer material, such as Sil-Pad® 400. Sil-Pad® is also manufactured by The Bergquist Company (see above) and is a composite of silicone rubber and fiberglass. Sil-Pad® is a thermally conductive insulator with a thermal impedance of 7.29° C. cm²/W (approximately 1.13° C. in²/W) at 345 kPa (approximately 50 psig). Other thermally conductive interface layers known independently in the art may be readily used as well.

Figure 3:
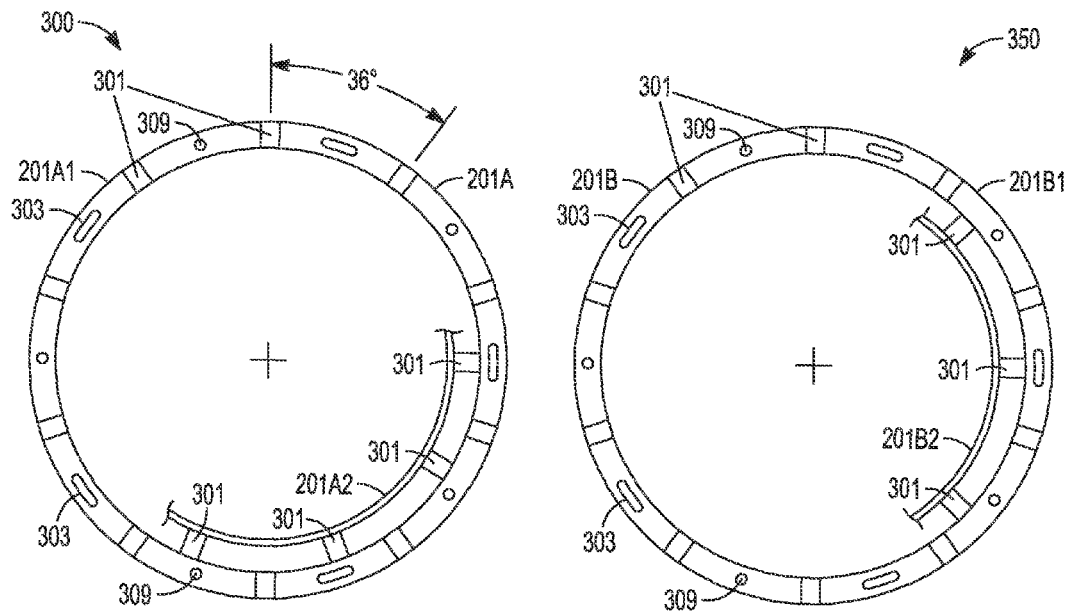
FIG. 3 is an exemplary plan (i.e., obverse) and back view of each portion of the clockable coupling ring of FIG. 2.

Referring now to FIG. 3, an exemplary bottom view 300 of the upper coupling ring portion 201A includes the plurality of raised pedestals 301 located on a lower face of the upper coupling ring portion 201A and/or the edge ring 217. Similarly an exemplary top view 350 of the lower coupling ring portion 201B includes another plurality of raised pedestals 301 on an upper face of the lower coupling ring portion 201B. The arrangement of the plurality of raised pedestals 301 allows the upper 201A and the lower 201B coupling ring portions to have variable mechanical contact areas when brought into physical contact with one another. The variable mechanical contact areas consequently allow variable thermal contact between the upper 201A and the lower 201B coupling ring portions as discussed immediately below. As will be readily recognizable to a skilled artisan upon reading the information disclosed herein, the plurality of raised pedestals may be varied in width, height, number, and other parameters to achieve a desired result.

Figure 4:
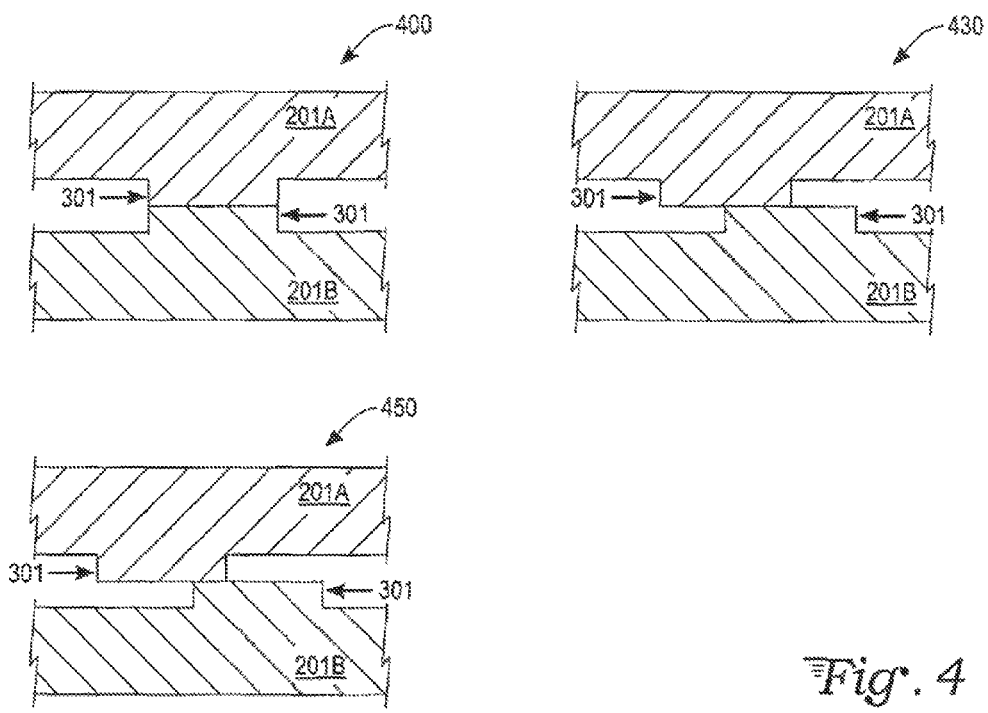
FIG. 4 shows cross-sectional views of varying thermal contact positions of the exemplary clockable coupling ring.

Referring to FIG. 4, a first cross-sectional view 400 of one of the plurality of raised pedestals 301 between the upper 201A and the lower 201B coupling ring portions indicates a maximum thermal contact area. A second cross-sectional view 430 of one of the plurality of raised pedestals 301 between the upper 201A and the lower 201B coupling ring portions indicates a thermal contact area having higher thermal impedance than the first cross-sectional view 400 due to a reduced mechanical contact area. Similarly, a third cross-sectional view 450 of one of the plurality of raised pedestals 301 between the upper 201A and the lower 201B coupling ring portions indicates a thermal contact area having an even higher thermal impedance than the second cross-sectional view 430 due to a further reduced mechanical contact area. An end-user may therefore provide either stepped or infinite variability (depending upon a mechanical or chemical joining means, discussed below) depending upon an amount of mechanical contact between the upper 201A and the lower 201B coupling ring portions.

Additionally, a piece (not shown in FIG. 4 but indicated as the optional coupling ring thermal interface material layer 203 of FIG. 2) of thermal interface material (either thermally conductive or thermally insulating) may be placed between one or more of the plurality of raised pedestals 301 to further affect an overall thermal conductivity between the upper 201A and the lower 201B coupling ring portions.

Therefore, a combination of the upper coupling ring portion 201A and the lower coupling ring portion 201B provides a clockable coupling ring by arranging the upper 201A and the lower 201B coupling ring portions in different mechanical contact arrangements to vary the thermal contact between the two portions.

Although not shown explicitly, a skilled artisan can readily discern various means to affix the upper coupling ring portion 201A and the lower coupling ring portion 201B to one another. In a specific exemplary embodiment, the two portions may be bolted to one another by, for example, a flat head machine screw passing through a countersink and hole 309 (FIG. 3) in one piece into a tapped and threaded hole 309 on the other piece. A plurality of threaded holes may be included in one piece that is placed in various offset positions from the countersunk holes in the other piece. In another specific exemplary embodiment, the two portions may be bolted to one another by, for example, a flat head machine screw passing through an elongated (i.e., slotted) countersink slot 303 (FIG. 3) in one piece into a tapped and threaded hole on the other piece. In still another exemplary embodiment, the two pieces may be affixed to one another by a high temperature adhesive.

Various arrangements of the upper coupling ring portion 201A and the lower coupling ring portion 201B, relative to one another, allows a means to adjust the thermal contact between any hot edge ring (HER) and an electrostatic chuck. Thus, various embodiment of the present invention operate by having the plurality of raised pedestals 301 in a pattern such that as the upper 201A and lower 201B coupling ring portions are rotated to a different orientation relative to one another, a different mechanical and, consequently, a different thermal contact area results. Different process recipes, requiring a different HER temperature, may be readily accommodated simply by changing an amount of mechanical contact between the upper 201A and lower 201B coupling ring portions.

In other exemplary embodiments (not shown but readily understandable by a skilled artisan upon reading the material discussed herein), the plurality of raised pedestals 301 may be arranged, either alternatively or in addition to the arrangement shown on the clockable coupling ring, between the ESC and coupling ring. Further, in still other exemplary embodiments, the plurality of raised pedestals 301 may be arranged, either alternatively or in addition to the arrangement shown on the clockable coupling ring, between the coupling ring and HER.

Moreover, additional embodiments include producing the plurality of raised pedestals 301, 305 such that the pedestal pattern has more finely scaled features (e.g., approximately 1 cm wide) so that azimuthal non-uniformities do not result. Further, the pattern of raised pedestals can be formed in several concentric rings 201A1, 201A2, 201B1, 201B2 of FIG. 3 so that a possibility of arcing (i.e., plasma light-up) in the gap between the two parts can be reduced or eliminated. Note that only a portion of the inner concentric rings 201A2, 201B2 is shown to avoid obscuring the drawing.

Rough and smooth areas can be substituted for the plurality of raised pedestals 301, 305 provided thermal contact between the two areas is different from one another. For example, a rough area prevents intimate contact between the upper 201A and lower 201B coupling ring portions, thus increasing thermal impedance. In contrast, a smooth area provides intimate contact between the upper 201A and lower 201B coupling ring portions, thus decreasing thermal impedance.

Additionally, various coatings that make good thermal contact and bad thermal contact can be substituted for the plurality of raised pedestals 301, 305 provided thermal contact between the two areas is different. For example, coatings with either different thicknesses or different thermal conductivities may be used to achieve a clockable system with adjustable thermal contact.

The present invention is described above with reference to specific embodiments thereof. It will, however, be evident to a skilled artisan that various modifications and changes can be made thereto without departing from the broader spirit and scope of the present invention as set forth in the appended claims.

For example, particular embodiments describe various material types and placements. A skilled artisan will recognize that these materials and placements may be varied and those shown herein are for exemplary purposes only in order to illustrate various aspects of the edge ring. For example, upon reading the information disclosed herein, a skilled artisan will quickly recognize that the thermal contact areas of the coupling ring may be incorporated either additionally or separately into a hot edge ring. In such an arrangement, the HER may be coupled directly to the ESC without a need for an interspersed coupling ring but while still providing the variability of thermal conductivity, and thus temperature on the HER, as discussed herein. Additionally, a skilled artisan will further recognize that the techniques and methods described herein may be applied to any similar sort of structure operating in a harsh plasma and chemical environment in which precise and accurate concentricity and placement need to be maintained. The application to an electrostatic chuck of the semiconductor industry is purely used as an exemplar to aid one of skill in the art in describing various embodiments of the present invention.

Moreover, the term semiconductor should be construed throughout the description to include data storage, flat panel display, as well as allied or other industries. These and various other embodiments are all within a scope of the present invention. The specification and drawings are, accordingly, to be regarded in an illustrative rather than a restrictive sense.

What is claimed is:

1. A clockable device for use with an electrostatic chuck configured to hold a substrate in a plasma environment, the clockable device comprising:
   a coupling ring configured to surround a periphery of at least a portion of the electrostatic chuck and thermally contact an edge ring mounted in proximity to the electrostatic chuck, the coupling ring comprising
      a first portion of the coupling ring having a first set of opposing faces, at least one of the first set of opposing faces having a first plurality of raised features formed thereon; and
      a second portion of the coupling ring having a second set of opposing faces, at least one of the second set of opposing faces having a second plurality of raised features formed thereon and arranged to be thermally coupled to the first plurality of raised features, the first portion of the coupling ring and the second portion of the coupling ring configured to have variable mechanical contact areas when brought into physical contact with one another, a degree of thermal coupling between the first and second portions configured to be controlled by clocking the first portion with respect to the second portion.

2. The clockable device of claim 1 wherein the first and second plurality of raised features are arranged radially on each of the first and second portions of the coupling ring.

3. The clockable device of claim 1 wherein the first and second plurality of raised features are arranged radially in a plurality of concentric rings on each of the first and second portions of the coupling ring, each of the plurality of raised features being thermally separated from a raised feature in either a subsequent or prior one of the plurality of concentric rings except at a base portion thereof.

4. The clockable device of claim 1 wherein the first and second plurality of raised features are separated from one another by a thermal interface layer placed between at least certain ones of the first and second plurality of raised features.

5. The clockable device of claim 1 wherein the first and second portions of the coupling ring are arranged to be bolted together such that at least portions of the first and second plurality of raised portions are in thermal contact with one another.

6. The clockable device of claim 1 wherein at least one of the first and second portions of the coupling ring have elongated slots to facilitate adjustable thermal contact between the portions by rotating the first portion with respect to the second portion.

7. A clockable device for use with an electrostatic chuck configured to hold a substrate in a plasma environment, the clockable device comprising:
   an edge ring configured to surround a periphery of at least a portion of the electrostatic chuck and thermally contact the electrostatic chuck, the edge ring comprising a lower face having a first plurality of raised features formed thereon; and
   a second plurality of raised features formed on a portion of the electrostatic chuck in thermal contact with the edge ring, the second plurality of raised features arranged to be thermally coupled to the first plurality of raised features, the lower portion of the edge ring and the portion of the electrostatic chuck in thermal contact with the edge ring configured to have variable mechanical contact areas when brought into physical contact with one another, a degree of thermal coupling between the edge ring and the electrostatic chuck configured to be controlled by clocking the edge ring with respect to the second plurality of raised features.

8. The clockable device of claim 7 wherein the first and second plurality of raised features are arranged radially on the edge ring and the electrostatic chuck.

9. The clockable device of claim 7 wherein the first and second plurality of raised features are arranged radially in a plurality of concentric rings on the edge ring and the electrostatic chuck, each of the plurality of raised features being thermally separated from a raised feature in either a subsequent or prior one of the plurality of concentric rings except at a base portion thereof.

10. The clockable device of claim 7 wherein the first and second plurality of raised features are separated from one another by a thermal interface layer placed between at least certain ones of the first and second plurality of raised features.

11. The clockable device of claim 7 wherein the edge ring and the electrostatic chuck are arranged to be bolted together such that at least portions of the first and second plurality of raised portions are in thermal contact with one another.

12. The clockable device of claim 7 wherein at least one of the edge ring and the electrostatic chuck have elongated slots to facilitate adjustable thermal contact therebetween by rotating the edge ring with respect to the electrostatic chuck.

13. A clockable device for use with an electrostatic chuck configured to hold a substrate in a plasma environment, the clockable device comprising:
   an edge ring configured to surround a periphery of at least a portion of the electrostatic chuck and thermally couple to the electrostatic chuck, the edge ring comprising a lower face having a first plurality of raised features formed thereon; and
   a coupling ring having at least a second plurality of raised features and configured to be placed into thermal contact with the first plurality of raised features on the edge ring, the second plurality of raised features arranged to be thermally coupled to the first plurality of raised features, the lower portion of the edge ring and the coupling ring configured to have variable mechanical contact areas when brought into physical contact with one another, a degree of thermal coupling between the edge ring and the coupling ring configured to be controlled by clocking the edge ring with respect to the coupling ring.

14. The clockable device of claim 13 wherein the first and second plurality of raised features are arranged radially on the edge ring and the coupling ring.

15. The clockable device of claim 13 wherein the first and second plurality of raised features are arranged radially in a plurality of concentric rings on the edge ring and the coupling ring, each of the plurality of raised features being thermally separated from a raised feature in either a subsequent or prior one of the plurality of concentric rings except at a base portion thereof.

16. The clockable device of claim 13 wherein the first and second plurality of raised features are separated from one another by a thermal interface layer placed between at least certain ones of the first and second plurality of raised features.

17. The clockable device of claim 13 wherein the edge ring and the coupling ring are arranged to be bolted together such that at least portions of the first and second plurality of raised portions are in thermal contact with one another.

18. The clockable device of claim 13 wherein at least one of the edge ring and the coupling ring have elongated slots to facilitate adjustable thermal contact therebetween by rotating the edge ring with respect to the coupling ring.

19. A clockable device for use with an electrostatic chuck configured to hold a substrate in a plasma environment, the clockable device comprising:
a first portion of the electrostatic chuck having at least one face with variable thermal contact areas located thereon;
a second portion of the electrostatic chuck having at least one face with variable thermal contact areas located thereon, the at least one face of the second portion configured to be placed in thermal contact with the at least one face of the first portion to control a thermal gradient across a face of the substrate, the first portion of the electrostatic chuck and the second portion of the electrostatic chuck configured to have variable mechanical contact areas when brought into physical contact with one another.

20. The clockable device of claim 19 wherein the variable thermal contact areas include a plurality of rough face and smooth face regions.

21. The clockable device of claim 19 wherein the variable contact areas include a plurality of differing thermal conductivity coatings formed upon the first and second portions.

22. The clockable device of claim 19 wherein the first and second portions having variable thermal contact areas are separated from one another by a thermal interface layer placed between at least certain ones of the first and second portions having variable thermal contact areas.

23. The clockable device of claim 19 wherein the first portion and the second portion are arranged to be bolted together such that at least portions of the first and second portions having variable thermal contact areas are in thermal contact with one another.

24. The clockable device of claim 19 wherein at least one of the first and second portions have elongated slots to facilitate adjustable thermal contact therebetween by rotating the first portion with respect to the second portion.

* * * * *